United States Patent [19]

Askin et al.

[11] Patent Number: 4,901,076
[45] Date of Patent: Feb. 13, 1990

[54] CIRCUIT FOR CONVERTING BETWEEN SERIAL AND PARALLEL DATA STREAMS BY HIGH SPEED ADDRESSING

[75] Inventors: Haluk O. Askin, Clinton Corners; Frank D. Ferraiolo, New Windsor, both of N.Y.

[73] Assignee: International Business Machines Corporation, Armonk, N.Y.

[21] Appl. No.: 114,178

[22] Filed: Oct. 29, 1987

[51] Int. Cl.$^4$ ............................................. H03K 13/02
[52] U.S. Cl. ................................... 341/100; 341/101
[58] Field of Search ................... 340/347 DD, 347 M; 377/28, 64, 73; 341/100, 101

[56] References Cited

U.S. PATENT DOCUMENTS

| | | | |
|---|---|---|---|
| 3,017,620 | 1/1962 | Abzug | 377/28 X |
| 3,792,362 | 2/1974 | Grant | 328/72 |
| 4,015,252 | 3/1977 | Symanski | 340/347 DD |
| 4,377,806 | 3/1983 | Elliott et al. | 340/347 DD |
| 4,425,562 | 1/1984 | Deniet | 341/100 |
| 4,429,300 | 1/1984 | Yamasawa et al. | 340/347 DD |
| 4,620,180 | 10/1986 | Carlton | 377/64 X |
| 4,642,629 | 2/1987 | Milligan | 340/825 |
| 4,675,652 | 6/1987 | Machado | 341/100 |
| 4,680,733 | 7/1987 | Duforestel et al. | 364/900 |
| 4,692,641 | 9/1987 | Highton | 341/100 |

OTHER PUBLICATIONS

IBM Technical Disclosure Bulletin, R. A. Schaadt, vol. 23, No. 2, Jul. 1980, "Shift Register Data Deserialization Without a Counter", pp. 516–517.

Primary Examiner—Vit W. Miska
Attorney, Agent, or Firm—Floyd A. Gonzalez

[57] ABSTRACT

A circuit for converting a multi-bit data signal from a first format to a second format. The circuit includes an input for receiving the multi-bit data signal in a first format, an output for providing the multi-bit data signal in a second format, and a ring counter having a number of stages for providing, in sequential order, stage output signals. A format conversion device connected between the input and the output has a number of latches with each latch being connected to the input for simultaneously receiving data bits of the multi-bit data signal in the first format. A control circuit is provided for controlling the latching of selected data bits in each of the latches, and a transmission circuit is provided between the latches and the output for transmitting the bits latched in the latches to the output responsive to the stage output signals of the ring counter, thereby placing the multi-bit data signal in the second format.

26 Claims, 6 Drawing Sheets

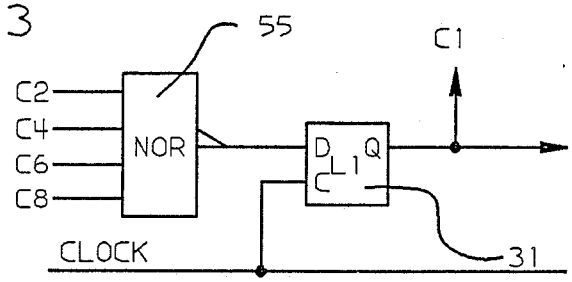
FIG. 3
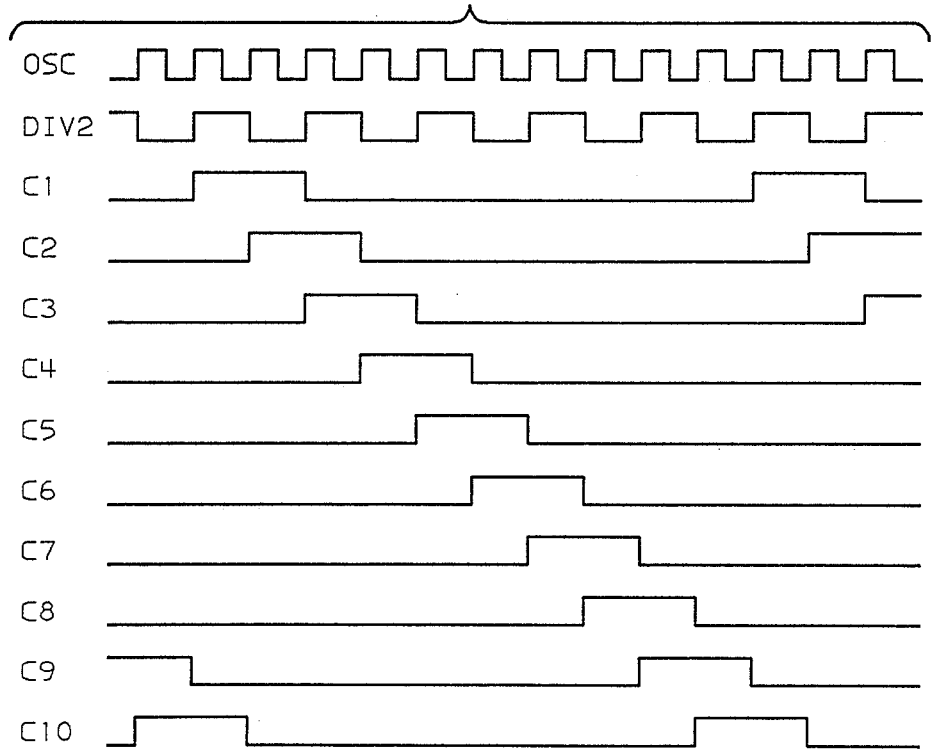
FIG. 7

CIRCUIT FOR CONVERTING BETWEEN SERIAL AND PARALLEL DATA STREAMS BY HIGH SPEED ADDRESSING

BACKGROUND OF THE INVENTION

The present invention relates to a circuit for serializing a multi-bit data signal from a parallel format to a serial format, or for deserializing the multi-bit data signal from a serial format to a parallel format.

Deserializer circuits are known in which serial data bits are shifted from one stage to the next in a multi-stage shift register as the data bits are read, the number of shifts counted by a counter circuit until a desired number of bits in a frame of data have been read. When the entire frame of data is in the shift register, the bits are then written from the stages of the shift register in a parallel format. When the last bit of the frame is read into such a circuit, all of the bits must be shifted from one stage to the next, the counter must determine that this is the last bit, and all of the bits must be written out in a parallel format, all before the first bit of the next frame may be read into the shift register.

U.S. Pat. No. 4,015,252, issued Mar. 29, 1977 to Symanski for "High Speed Serial Data Synchronization Scheme" discloses a serial-to-parallel circuit having a plurality of active logic elements forming multiple delay lines. Data bits of serial data are transmitted down the delay lines until all of the data bits are at their respective delay line outputs. The data bits are then clocked into flip-flops as a parallel data word.

In an article by R. A. Schaadt titled "Shift Register Data Deserialization Without a Counter," IBM Technical Disclosure Bulletin, Vol. 23, No. 2, July 1980, a circuit is disclosed in which serial data bits of a byte of data and a marker are shifted through the stages of a shift register to determine when deserialization is complete. When the marker reaches the end of the shift register, the data bits are written out in a parallel format and all of the stages except the first are reset, with the set condition of the first stage acting as the marker for the next byte of data.

U.S. Pat. No. 4,377,806 issued Mar. 22, 1983 to Elliott et al for "Parallel to Serial Converter" discloses a converter for use in recording channel applications. The converter includes multiple channel input terminals adapted to receive parallel coded symbol inputs. Each bit received by an input is delayed incrementally by a predetermined amount depending upon the input line upon which it is received.

U.S. Pat. No. 4,429,300 issued Jan. 31, 1984 to Yamasawa et al for "High Speed Shift Register Circuit" discloses a shift register usable with a parallel to serial converter or a serial to parallel converter in which data bits are shifted through the shift register. Each bit of the shift register is set so as to become a predetermined logic condition. A detecting device detects whether or not the shift register has carried out the shift operations a predetermined number of times on the basis of the logical conditions of the bits in the shift register.

U.S. Pat. No. 4,680,733 issued July 14, 1987 to Duforestel et al for "Device for Serializing/Deserializing Bit Configurations of Variable Length" discloses circuitry for loading or reading bit configurations into or out of strings of latches formed in a ring under the control of a service processor.

SUMMARY OF THE INVENTION

A serializer-deserializer circuit is disclosed for converting a multi-bit data signal from a first format to a second format. The circuit includes an input for receiving the multi-bit data signal in a first format, an output for providing the multi-bit data signal in a second format, and a ring counter having a number of stages for providing, in sequential order, stage output signals. A format conversion device connected between the input and the output has a number of latches with each latch being connected to the input for simultaneously receiving data bits of the multi-bit data signal in the first format. A control circuit is provided for controlling the latching of selected data bits in each of the latches, and a transmission circuit is provided between the latches and the output for transmitting the bits latched in the latches to the output responsive to the stage output signals of the ring counter, thereby placing the multi-bit data signal in the second format. Since the data bits being converted from one format to another format are not shifted through a shift register, a serializer-deserializer circuit results which is useable with a data transmission system having high data rates such as a systems using fiber optics.

Thus, it is an object of the present invention to provide a serializer-deserializer circuit for converting a multi-bit data signal from one format to another useable with a data transmission system having high data rates.

It is another object of the present invention to provide a serializer-deserializer circuit having a multi-stage ring counter, and a plurality of data latches, wherein each data latch latches a selected data bit of a multi-bit signal to be converted responsive to being addressed by an output signal from one of the ring counter stages.

It is another object of the present invention to provide a serializer-deserializer circuit having a plurality of latches and a ring counter wherein the data bits of a multi-bit data signal are simultaneously provided to the inputs of the latches in one format, and the ring counter causes the writing of the data bits from the outputs of the latches in another format.

The foregoing and other objects, features and advantages of the invention will be apparent from the following more particular description of the preferred embodiments of the invention as illustrated in the drawings.

BRIEF DESCRIPTION OF THE DRAWINGS

FIG. 3 is a schematic diagram of a second embodiment of a portion of the ring counter of FIG. 2;

FIG. 7 is a timing diagram showing the relationship of various signals of the serializer circuit of FIG. 6.

DESCRIPTION OF THE PREFERRED EMBODIMENT

Figure 1:
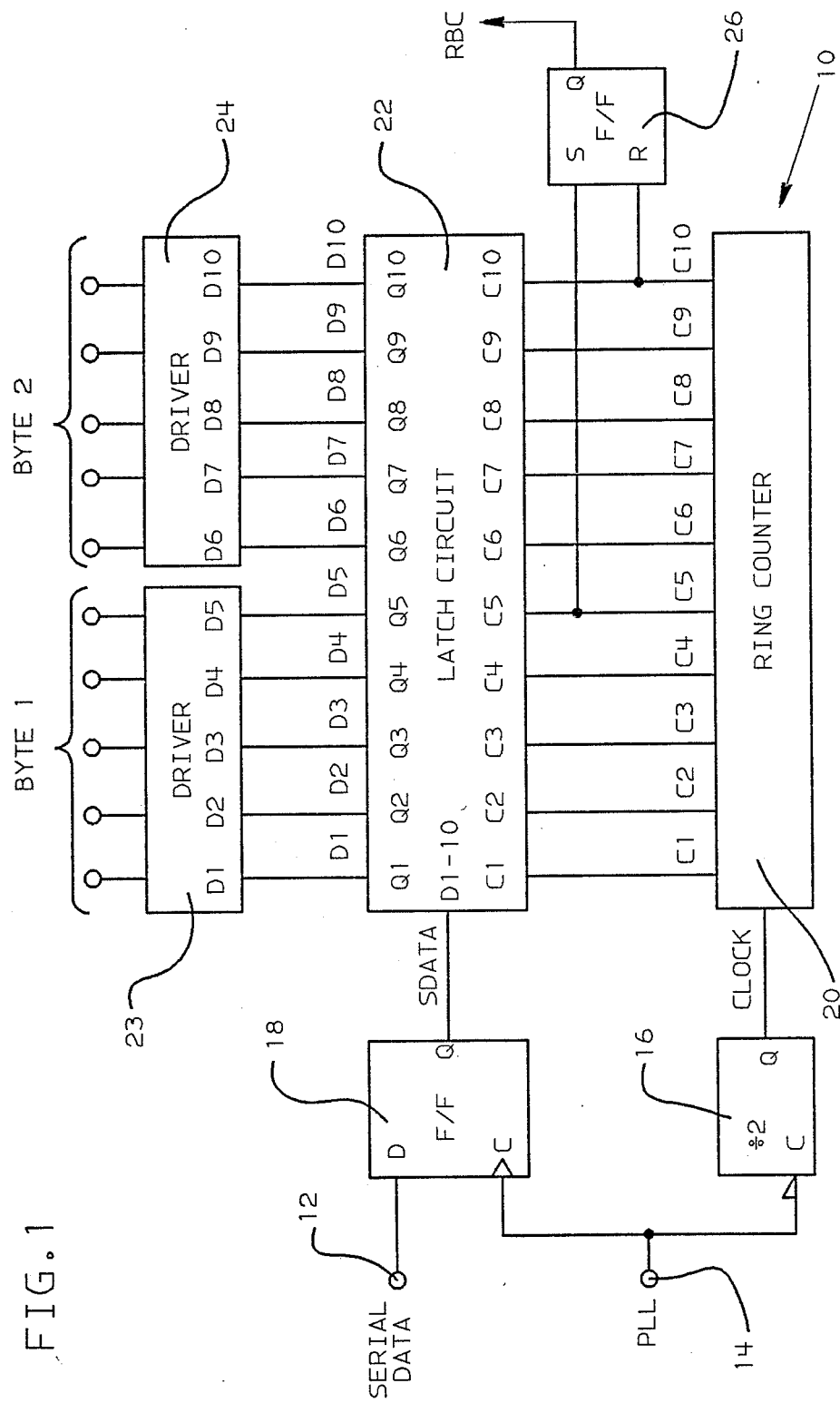
FIg. 1 is a block diagram of a deserializer circuit of the present invention.

FIG. 1 is a block diagram of one embodiment of the present invention connected as a deserializer circuit 10.

The deserializer 10 includes an input 12 for receiving a multibit serial data signal, designated SERIAL-DATA, transmitted in frames having a set number of bits per frame. In the present embodiment, the deserializer 10 is designed to convert 10 serial bits to a pair of 5-bit parallel bytes, however, the number of bits per byte or frame may be changed as desired. The deserializer 10 further includes an input 14 for receiving a timing signal PLL from a timing device such as a phase-locked-loop (not shown) for providing the bit times of the bits in the SERIAL-DATA signal. The PLL signal clocks a negative edge triggered flip-flop 16 which acts as a divide-by-two circuit, and also clocks a D-type positive edge triggered flip-flop 18. The flip-flop 18 is a control device which retimes the SERIAL-DATA data signal received at input 12 into a data signal designated SDATA. A clock signal designated CLOCK, appears at the Q output of the divide-by-two circuit 16, and is inputted into a ring counter 20 which sequentially produces output signals C1 through C10. The SDATA signal from flip-flop 18 is inputted into a latch circuit 22 having a plurality of latches, each latch being addressed by and receiving a respective one of the output signals C1 through C10 from the ring counter 20. As will be discussed later in connection with FIG. 2, all of the serial data bits in the SDATA signal are simultaneously presented to each of the latches in the latch circuit 22. The timing of the signals C1 through C10 from ring counter 20 and the SDATA signal from flip-flop 18 is such that each latch of the latch circuit 22 latches only its designated bit in the SDATA signal. In this way, parallel data bits D1 through D10 from the deserializer 10 are presented on the outputs Q1 through Q10 of the latch circuit 22 as they are latched. A pair of drivers 23 and 24 are provided for driving a parallel data bus (not shown) with the data bits from the latch circuit 22 at a time when the parallel data bits are valid. Driver 23 drives a first byte composed of data bits D1 through D5, and driver 24 drives a second byte composed of data bits D6 through D10. A set-reset flip-flop 26 provides a receive byte clock which produces an RBC signal indicating when the data bytes are valid and ready for transmission. The set input of the flip-flop 26 is connected to the C5 output of the ring counter 20, and the reset input of flip-flop 26 is connected to the C10 output of ring counter 20. When the Q output of the flip-flop 26 produces a negative going edge, the bits 1 through 5 are valid, and when a positive going edge is produced, bits 6 through 10 are valid. The RBC signal of flip-flop 26 may be used by a circuit, such as a bus controller (not shown), to control the transmission of the bits on a parallel bus when the data bits are valid, in a manner well understood in the art.

Figure 2:
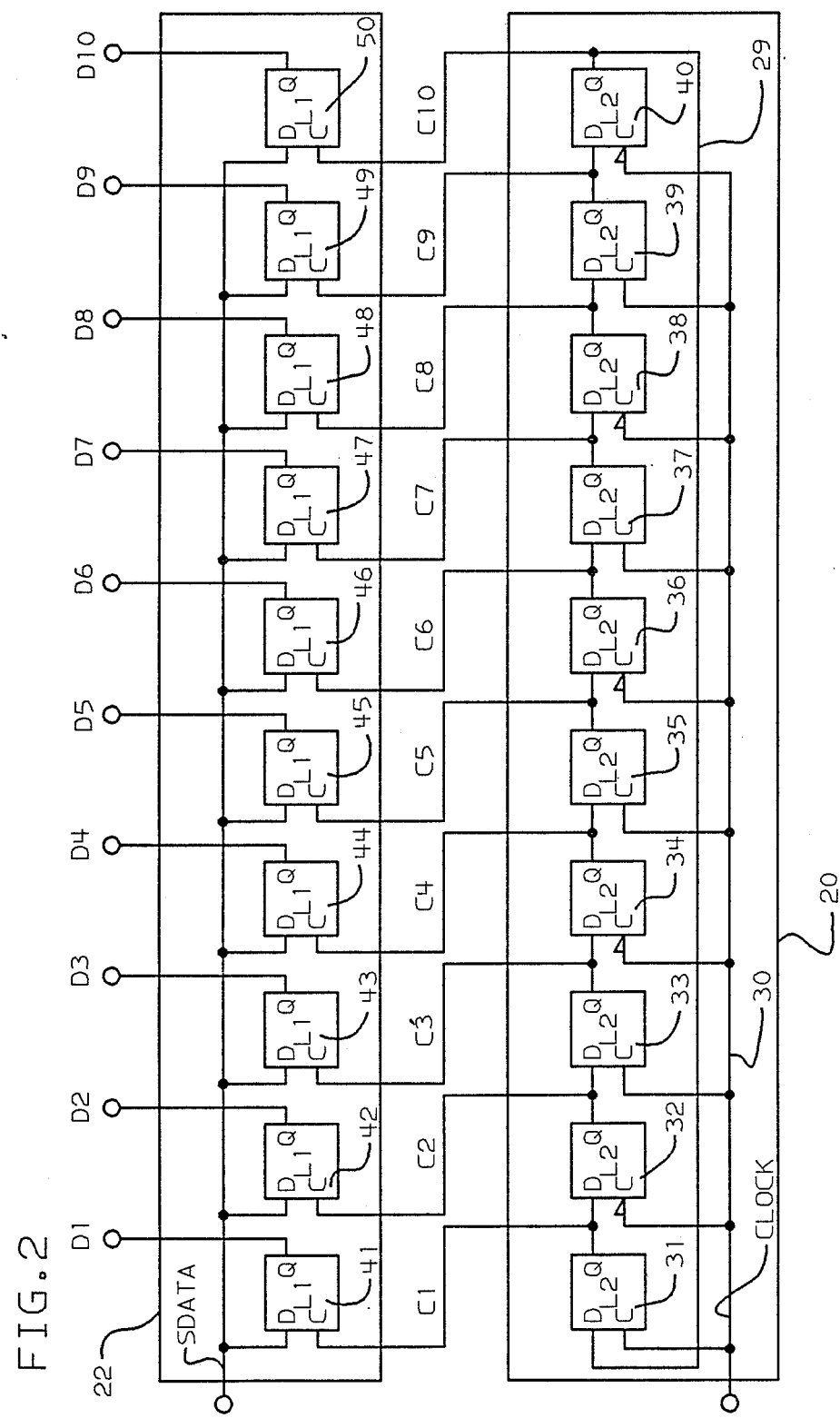
FIG. 2 is a block diagram of a ring counter and latch circuit of the deserializer circuit of FIG. 1.

FIG. 2 is a block diagram showing the elements of the ring counter 20 and the latch circuit 22 of the deserializer 10 of FIG. 1. The ring counter 20 has a plurality of stages or latches 31 through 40, one stage for each of the data bits D1 through D10, respectively. The ring counter 20 includes a CLOCK line 30 for providing the CLOCK signal to the C inputs of the latches 31 through 40. The odd numbered latches, that is latches 31, 33, 35, 37 and 39 (herein designated L1 latches), latch on the positive going edge of the CLOCK signal, and the even numbered latches, that is 32, 34, 36, 38 and 40 (herein designated L2 latches), latch on the negative going edge of the CLOCK signal. The Q output of each latch 31 through 40 is connected to the D input of the immediately following latch. For instance, the Q output of the L1 latch 31 is connected to the D input of the L2 latch 32. In the case of the last L2 latch 40, its Q output is connected to the D input of the L1 latch 31 via a conductor 29. The Q output of each of the latches 31 through 40 provides its respective output signal designated C1 through C10.

The latch circuit 22 includes a plurality of L1 latches 41 through 50, one L1 latch for each of the latches 31 through 40 of the ring counter 20, respectively. The SDATA signal is connected to the D input of each of the latches 41 through 50 via a conductor 51. The C input of each of the latches 41 through 50 receives its respective clocking signal (one of the C1 through C10 signals) from its respective one of the latches 31 through 40 of the ring counter 20. The Q output of each of the latches 41 through 50 is connected to its respective data output terminal D1 through D10 for transmission of the data bits to their respective input terminals of the drivers 23 and 24 (see FIG. 1).

In the embodiment of FIG. 2, the latches 31 through 39 of the ring counter 20 are initially rest such that their Q outputs are in the zero or low condition, and the latch 40 is set such that its Q output is in the one or high condition. On the first positive going edge of the CLOCK signal on conductor 30, the output signal C1 of latch 31 goes high. This high is input into the D input of the latch 32. On the first negative going edge of the CLOCK signal on conductor 30, the latch 32 latches the high on its input such that its output signal C2 goes high. Since the output signal C9 of latch 39 is low, the output signal C10, of the latch 40 also goes low on the first negative edge of the CLOCK signal on conductor 30. This low output signal C10 is inputted into the D input of the latch 31 via conductor 29 such that on the next positive going edge of the CLOCK signal on conductor 30, the output signal C1 of latch 31 also goes low. In this way, a counter signal (the initial high on the Q output of latch 40) is shifted throughout the length of the ring counter 20, appearing on each Q output of latches 31 through 40 as output signals C1 through C10, respectively. As each signal C1 through C10 goes to its one or high condition, its connected positive edge triggered latch 41 through 50 of the latch circuit 22 is enabled. As each of the signals C1 through C10 returns to its zero or low condition, the data bit of the SDATA signal then on conductor 51 will be latched by the respective latch 41 through 50. As will be explained, each data bit latched into one of the latches 41 through 50 represents a data bit of the SERIAL-DATA signal received at the input 12 of FIG. 1.

FIG. 3 is a block diagram of an alternate circuit for inputting the initial one or high condition into the D input of the L1 latch 31 of the ring counter 20. In FIG. 3, a multiple input NOR gate 55 has its inputs connected to the Q outputs of latches 32, 34, 36 and 38 to receive the C1, C4, C6 and C8 signals. The Q output of the NOR gate 55 is connected to the D input of the latch 31 of the ring counter 20. It will be understood that when the signals C1, C4, C6 and C8 are simultaneously in their zero conditions, a one or high will be placed on the D input of the latch 31 to restart the ring counter 20. It will thus be seen that the Q outputs of all of the even numbered latches, except for the last even numbered latch 40, are connected to the inputs of the NOR gate 55. The circuit of FIG. 3 has the advantage that it is self-correcting.

Figure 4:
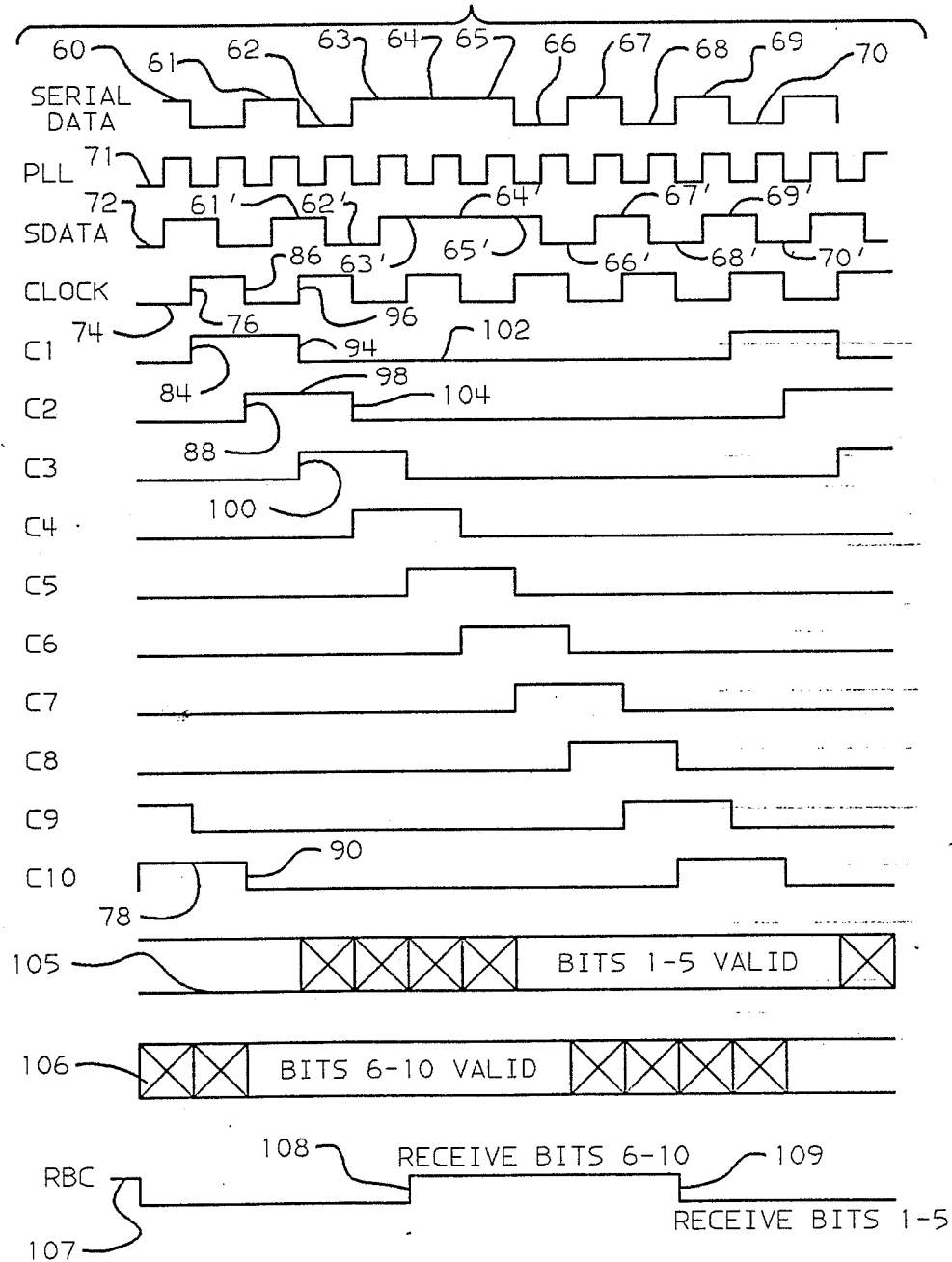
FIG. 4 is a timing diagram showing the relationship of various signals of the deserializer circuit of FIG. 1.

FIG. 4 is a timing diagram showing the relationship of the SERIAL-DATA, PLL, SDATA, CLOCK, and C1 through C10 signals. Waveform 60 of FIG. 4 is an example of the SERIAL-DATA signal data bits which are inputted at input 12 of the deserializer 10 of FIG. 1. The SERIAL-DATA signal 60 has a series of serial bits 61 through 70 (which represent serial data bits 1–10). In the disclosed example, when the SERIAL-DATA signal 60 is at a high, as shown at 61,63,64,65,67 and 69, a one bit is being transmitted, and when the signal 60 is at a low, such as at 62,66,68 and 70, a zero bit is being transmitted. Waveform 71 of FIG. 4 is an illustration of the PLL signal inputted into input 14 of the deserializer 10 of FIG. 1. It will be noted that the PLL signal 71 has positive going edges centered on each of the serial bits 61 through 70 of the SERIAL-DATA signal 60 which are used to sense the condition of the serial bits 61 through 70. The timing between the SERIAL-DATA signal 60 and the PLL signal 71 is preferred as it provides for sensing the values of the bits 61 through 70 when they are generally at a steady-state condition unaffected by skewing and propagation distortion caused by the transmission of the SERIAL-DATA signal over transmission lines.

The waveform 72 of FIG. 4 is a waveform of the SDATA signal outputted at the Q output of the flip-flop 18 of FIG. 1. Referring to FIG. 1, it will be seen that the flip-flop 18 is clocked by each positive going edge of the PLL signal, placing the bit value of the SERIAL-DATA signal then on the D input of flip-flop 18 on its Q output. Referring now to FIG. 4, it will be understood that the serial bits 61 through 70 are controlled or retimed by the flip-flop 18 to start at the positive going edge of the PLL signal of 71, as indicated by the bit values 61' through 70' of the SDATA signal 72. The divide-by-two circuit 16 of FIG. 1 is clocked by the negative going edges of the PLL signal such that the CLOCK signal, shown by waveform 74, changes state at every negative going edge of the PLL signal of waveform 71. Thus, each transition of the CLOCK signal 74 will be generally centered on one of the data bits 61' to 70' of the retimed data signal SDATA 72.

Referring now to FIGS. 2 and 4, when the L1 latch 31 is clocked by the positive going edge 76 of the CLOCK signal 74, the C10 signal is high at 78, causing the C1 signal to go high at 84. The high C1 signal clocks the L1 latch 41 of FIG. 2 for reading the condition of the SDATA signal 72 on conductor 51. At the next negative going edge of the PLL signal 70, the CLOCK signal 74 will change states at 86. On the negative going edge 86, the L2 latch 32 of FIG. 2 will be clocked, thereby reading the condition of signal C1, causing C2 to go high at 88. If the embodiment of FIG. 2 is used, the C10 signal of the L2 latch 40 will go low at 90, which low is transmitted over conductor 29 to the D input of the L1 latch 31. If, however, the embodiment of FIG. 3 is used, the positive going edge 88 of the C2 signal inputted into the NOR gate 55 causes the output of NOR gate 55 to go low, which low is inputted into the D input of the L1 latch 31. With either embodiment, the low condition inputted into the L1 latch 31 causes the C1 signal to have a negative going edge at 94 at the next positive going edge 96 of the CLOCK signal 74, thereby latching into the latch 41, the serial bit 61' of the SDATA signal 72 which is then present on the conductor 51 of FIG. 2. It will be understood that the high 98 of the C2 signal will cause the C3 signal of the L1 latch 33 to go high at 100, and the low at 102 of the C1 signal will cause the C2 signal of the L2 latch 32 to go low at 104. Thus, the ring counter 20 of FIGS. 1 and 2 will continue, in this fashion, to count in a sequential manner, latching the retimed data bits 62' through 70' into latches 42 through 50 in a similar manner.

Waveform 105 of FIG. 4 shows when the bits 1–5 are valid, waveform 106 shows when the bits 6–10 of the previous deserializer cycle are valid, and the relationship of the 105 and 106 waveform to the RBC signal 107 of the flip-flop 26. It will be seen that the RBC signal 107 has a positive going edge 108 generally in the center of the time when the bits 6–10 are valid, and a negative going edge 109 generally in the center of the time when the bits 1–5 are valid. Thus, the edges 108 and 109 may be used as timing events to indicate when to start reading valid bits from the deserializer 10.

It will be understood that the deserializer 10 does not provide for determining byte boundaries in the bits being deserialized. It is up to the user to properly establish a byte boundary. A skip bit function may be added to invert or non-invert the CLOCK signal to the ring counter 10, hence bumping the counter 20 by one bit. Such a skip bit function may then be used, in conjunction with byte boundary logic, to move the byte boundary one bit at a time, until byte synchronization is properly established.

Figure 5:
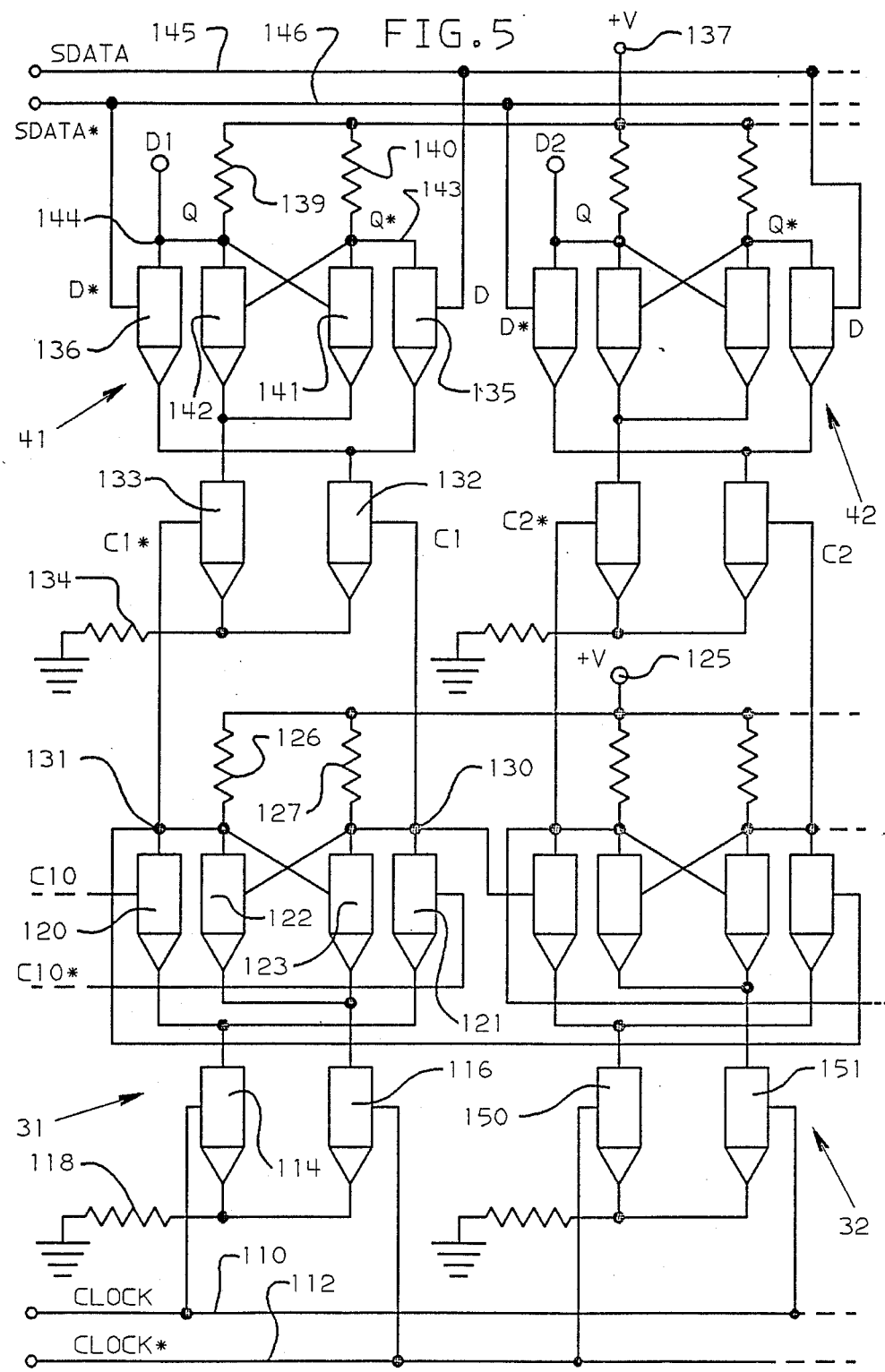
FIG. 5 is a schematic diagram of the first two stages of the ring counter and the first two latches of the latch circuit of the deserializer circuit of FIG. 1.

FIG. 5 is a schematic diagram of one embodiment of two stages of the deserializer 10 of FIGS. 1 and 2. The embodiment of FIG. 5 shows L1 latches 41 and 42 of the latch circuit 22, and the L1 latch 31 and L2 latch 32 of the ring counter 20. In the embodiment of FIG. 5, complementary logic is used. In this logic, each input and output signal has a complement signal, such that inverters are not necessary. It is only necessary to exchange an input or output signal with its complement signal to effect an inversion. It will be understood that when using this logic, the inputs and outputs of the elements of FIGS. 1, 2 and 3 will provide for both true signals and complemented signals. The latches of FIG. 5 may be composed of npn transistors, which may be formed on a single chip, however, other technologies or components may be used to form the L1 and L2 latches shown, as desired. In the embodiment of FIG. 5, the CLOCK signal is inputted into the L1 latch 31 of the ring counter over a CLOCK signal conductor 110. The complement CLOCK signal, designated CLOCK*, is inputted over a CLOCK* conductor 112. The base of a transistor 114 is connected to the CLOCK conductor 110, and the base of a transistor 116 is connected to the CLOCK* conductor 112. The emitters of the transistors 114 and 116 are connected to a current source shown as a grounded resistor 118. When the transistor 114 is turned on, a circuit is completed to transistors 120 and 121, whose bases, when the embodiment of FIG. 2 is used, receive the C10 signal and its complement C10*, respectively, from the tenth stage of the ring counter 20. When the embodiment of FIG. 3 is used, the bases of the transistors 120 and 121 will be connected to the outputs of the NOR gate 55.

When the transistor 116 is turned on, a circuit is completed through the transistors 122 and 123, whose collectors are cross-connected with their bases, as shown. The collectors of the transistors 120 and 122 are connected at a node 131 to a positive 3.5 volt voltage supply at 125 through a resistor 126, and the collectors of the transistors 121 and 123 are connected at a node 130 to the voltage supply at 125 through a resistor 127. It will be understood that when transistor 114 is turned on, the condition of C10 will appear on node 130, and the condition of its complement C10* will appear on the node 131. For instance, if C10 is high, transistor 120 will be turned on, grounding the node 131 through transistors 120 and 114, whereas the complement signal C10* will be low holding off transistor 121 and allowing node 130 to rise to the voltage level of the voltage at 125 through resistor 127. When the CLOCK* signal on conductor 112 goes high, transistor 116 will be turned on, latching the conditions of the nodes 130 and 131 by the action of cross-connected transistors 122 and 123.

The base of a transistor 132 (the C terminal of the latch 41) is connected to the node 130, and the base of a transistor 133 (the C* terminal of the latch 41) is connected to the node 131. The emitters of the transistors 132 and 133 are connected to a current source shown as a grounded resistor 134. The turning on of transistor 132 completes a circuit to transistors 135 and 136 whose collectors are connected to a 5 volt voltage supply at 137 through resistors 139 and 140, respectively. When the transistor 133 is turned on, a circuit is completed through transistors 141 and 142 whose collectors and bases are cross-coupled. The collectors of transistors 135 and 141 are connected at a node 143 (the Q* terminal of the latch 41), and the collectors of the transistors 136 and 142 are connected at a node 144 (the Q terminal of the latch 41). The D1 output of the latch circuit 22 (see FIGS. 1 and 2) is connected to the Q node 144. The SDATA signal is supplied to a SDATA conductor 145, and the complement of the SDATA signal, designated SDATA*, is applied to a SDATA* conductor 146. The conductor 145 is connected to the base of the transistor 135 (the D terminal of the latch 41) and the conductor 136 is connected to the base of transistor 136 (The D* terminal of the latch 41). It will thus be seen that when the C1 signal on the node 130 is high, and its complement C1*, on the node 131 is low, the transistor 132 will be turned on such that the condition on the SDATA conductor 145 appears on the Q output at node 144 and the connected D1 output. For instance, when the transistor 132 is turned on and the SDATA conductor 145 is high, transistor 135 will be turned on, grounding the Q* output at node 143 through the transistors 132 and 135. The complement signal SDATA* will be low, turning off transistor 136 such that the Q output at node 144 and the D1 output may rise to the value of the voltage at the terminal 137 through the resistor 139. As discussed in connection with FIG. 4, the C1 signal on the base of the transistor 132 will remain high until the positive going edge 96 of the CLOCK signal. The C1 signal will then go low at 94, at which time its complement C1* will go high, turning on transistor 133 and latching the condition of the nodes 143 and 144 by the action of the cross-coupled transistors 141 and 142.

The second stage of the deserializer circuit 10 is formed of transistors which are connected similar to those discussed in connection with latches 31 and 41, except that the L2 latch 32 is connected to trigger on negative going edges of the CLOCK signal. This is done by providing a transistor 150 which is similar to the transistor 114 except that its base is connected to the CLOCK* conductor 112, and a transistor 151 which is similar to the transistor 116 except that its base is connected to the CLOCK conductor 110. It will thus be understood that the L2 latch 32 latches the C1 signal and its complement C1* when the signal on the CLOCK* conductor 112 is high (when the CLOCK signal is low). The circuit of FIG. 5 provides two stages of a deserializer circuit in which the C1 and C2 signals from the ring counter 20 are each two CLOCK signal pulses wide, but which overlap for one CLOCK signal pulse width (see FIG. 4). Also, the latches 41 and 42 of the deserializer circuit 10 do not latch until the generally steady state condition of their respective bits (bits 61' and 62' of FIG. 4) are present on the SDATA conductor.

Figure 6:
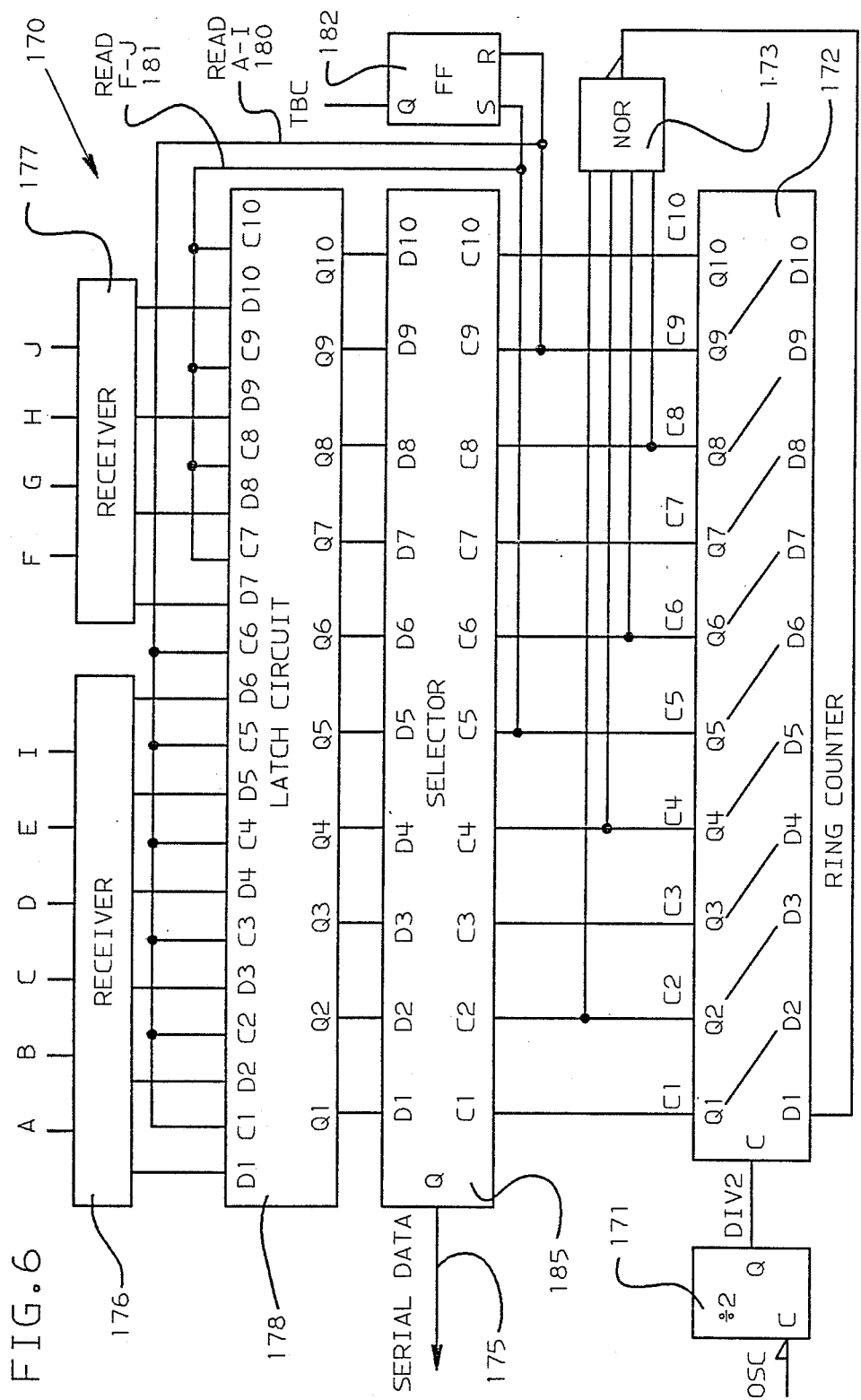
FIG. 6 is a block diagram of a serializer circuit of the present invention.

FIG. 6 is a block diagram of another embodiment of the present invention connected as a serializer 170. The serializer 170 includes a divide-by-two circuit 171, ring counter 172 and NOR gate 173 which are similar to the divide-by-two circuit 16 of FIG. 1, the ring counter 20 of FIGS. 1 and 2, and the NOR gate 55 of FIG. 3. An oscillator signal OSC, which times the bit times of the serial data signal coming from the serializer 170, is inputted into the divide-by-two circuit 171, whose output supplies a clock signal DIV2 to the ring counter 172. The ring counter 172 has ten stages, each stage generating one of the output signals C1 through C10, respectively, as discussed in connection with the ring counter 20 of FIGS. 1 and 2. In the embodiment of FIG. 6, the serializer 170 receives ten parallel bits, designated A through J, and places them on a SERIAL DATA line 175 as serial bits. The bits A through J are received from a parallel bus (not shown) in two bytes, the first byte having six bits and the second byte having four bits. Bits A, B, C, D, E and I of the first byte are simultaneously received by a first receiver 176, and bits F, G, H and J are simultaneously received by a second receiver 177. Each of the outputs of the receivers 176 and 177 is connected to one of the inputs of a latch circuit 178 having a plurality of latches such that each of the bits A through J received by the receivers 176 and 177 is latched into a respective latch of the latch circuit 178.

A first read line 180 receives the C9 signal for controlling the simultaneous clocking of each of the bits A, B, C, D, E and I of the first byte into one of the first six latches of the latch circuit 178, and a second read line 181 receives the C5 signal for controlling the simultaneous clocking each of the bits F, G, H and J into one of the last four latches of the latches circuit 178. The signal C5 is inputted into the S terminal of a set-reset flip-flop 182, and the signal C9 is inputted into its R terminal. The Q output of the flip-flop 182 provides a transmission byte clock (TBC) signal for controlling the transmission of the data bytes to the receivers 176 and 177. It will be understood that when the C9 signal goes high, the bits of the first byte received by the receiver 176 will be simultaneously clocked into the latch circuit 178, and the flip-flop 182 will be reset. When the C5 signal goes high, the bits of the second byte will be simultaneously clocked into the latch circuit 178, and the flip-flop 182 will be set. The TBC signal instructs a bus controller (not shown) when to transmit bits of the respective bytes for receipt by the receivers 176 and 177.

A selector circuit 185 is connected between the ring counter 172 and the latch circuit 178. The Q outputs of the stages of the ring counter 172 are connected to respective ones of the C inputs of the selector circuit 185, and the Q outputs of the latches of the latches circuit 178 are connected to respective ones of the corresponding D inputs of the selector circuit 185. Upon the receipt of a positive going edge of a signal on the C input of each stage of the selector circuit 185, the bit on the respective D input of the selector circuit 185 will be placed on its Q output for transmission to the connected SERIAL DATA line 175. Thus, the ring counter 172 sequentially enables the signals C1 through C10, which in turn addresses the respective C1 through C10 inputs of the selector 185 to cause the sequential transmission of the respective bits A through J from the latches circuit 178 to the SERIAL DATA line 175.

FIG. 7 is a timing diagram of the various signals of the serializer circuit 170 of FIG. 6. It will be understood that the number of bits per byte, and the total number of bits serialized by the serializer circuit 170, may be changed as desired.

Returning to FIG. 5, it will be understood that construction identical to latches 31 and 32 may be used for the stages of the counter 172 of the embodiment of FIG. 6. Also, the construction of latches 41 and 42 may be used to construct the latches of the latch circuit 178. However, in the embodiment of FIG. 6, the CLOCK conductor 110 and its complement would carry the output DIV2 signal and its complement from the divide-by-two circuit 171. Also, each D and D* input of each latch (for instance, the bases of transistors 135 and 136, respectively) would be connected to one of the outputs of the receivers 176 and 177. Each of the Q outputs (for instance, node 144 of the latch 41) would be connected to a separate Q input of a selector circuit 185, as discussed in connection with FIG. 6. Also, the C and C* inputs of each latch (for instance, the bases of the transistors 132 and 133, respectively) would be connected to one of their respective read lines 180 or 181 (see FIG. 170) such that the latches would be controlled to simultaneously latch the parallel data bits as previously discussed.

While we have illustrated and described preferred embodiments of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. A circuit for converting a multi-bit data signal from a first format to a second format, said circuit comprising:

input means for receiving said multi-bit data signal in said first format;

output means for providing said multi-bit data signal in said second format;

ring counter means having a plurality of stages, each stage having an output, the outputs of said plurality of stages for providing, in sequential order stage output signals;

format conversion means connected between said input means and said output means, said format conversion means having a plurality of latches, each latch being connected to said input means for simultaneously receiving data bits of the multi-bit data signal in said first format, control means for controlling the latching of selected data bits from said input means into each of said latches, and transmission means between said latches and said output means for sequentially transmitting the bits latched in said latches to said output means responsive to being addressed by the sequential stage output signals of said ring counter means, thereby placing the multi-bit data signal in said second format;

clock means having an input terminal for receiving a timing signal, said timing signal timing the bit times of said multi-bit signal either received by said input means or output by said output means in a serial format, said clock means further having an output terminal for producing a clock signal having one clock transition for each bit time of said timing signal;

each of said plurality of stages comprising a latch having a D input, a Q input, and a C input, said C input connected to the output terminal of said clock means, the Q output of each of said latches being connected to the D input of the latch of the succeeding stage for shifting a counter signal from stage to stage; and initial signal means connected to the D input of the latch of the first stage of said ring counter for starting said counter signal being shifted from stage to stage, wherein a shift of said counter signal occurs from one stage to the succeeding stage for each clock transition of said clock signal.

2. The circuit of claim 1 wherein the odd numbered stages of said ring counter are positive edge triggered latches, and the even numbered stages of said ring counter are negative edge triggered latches.

3. The circuit of claim 2 wherein said initial signal means is a conductor connected between the Q output of the last stage of said ring counter and the D input of the first stage of said ring counter.

4. The circuit of claim 3 wherein said initial signal means is a multi-input NOR gate having one of its inputs connected to the Q output of each of the even numbered stages of the ring counter except for the last even numbered stage, and its output connected to the D input of the first stage of said ring counter.

5. The circuit of claim 4 wherein said ring counter has ten stages, and the inputs of said NOR gate are connected to the second, forth, sixth and eighth stages, respectively.

6. A circuit for converting a multi-bit data signal from a first format to a second format, said circuit comprising:

input means for receiving said multi-bit data signal in said first format;

output means for providing said multi-bit data signal in said second format;

ring counter means having a plurality of stages each stage having an output, the outputs of said plurality of stages for providing, in sequential order stage output signals; and format conversion means connected between said input means and said output means, said format conversion means having a plurality of latches, each latch being connected to said input means for simultaneously receiving data bits of the multi-bit data signal in said first format, control means for controlling the latching of selected data bits from said input means into each of said latches, and transmission means between said latches and said output means for sequentially transmitting the bits latched in said latches to said output means as said latches are addressed by the sequential stage output signals of said ring counter means, thereby placing the multi-bit data signal in said second format;

said output means includes driver means having a plurality of input terminals for together receiving said multi-bit data signal in a parallel format from said format conversion means, and a plurality of output terminals for together providing said multi-bit data signal in the parallel format received on its input terminals;

each of said latches in said format conversion means comprises a C input for receiving its respective stage output signal from said ring counter means, a D input connected to said input means for receiving said multi-bit data signal in a serial format, and a Q output, each of said latches reading the bit value of said multi-bit data signal on its D input when the respective output signal on its clock input has a first value, and for latching therein the bit value of said multi-bit data signal on its D input when the respective stage output signal on its C input is in a transition from said first value to a second value; and said transmission means comprises a conductor between the Q output of each of said plurality of latches and the corresponding one of the plurality of inputs of said driver means such that the bit value latched in each of said latches is transmitted to its respective driver means input.

7. The circuit of claim 2 wherein said control means comprises a flip-flop having a D input connected to said input means, a C input for receiving said timing signal and a Q output connected to all of the D inputs of said latches.

8. The circuit of claim 7 wherein said output means is divided for providing two bytes of data in parallel format, each byte having a plurality of bits; and further comprising a receive byte clock means connected to said ring counter means for controlling the transmission of each of said bytes of data from said output means at a time when all of the bits of the byte of data to be transmitted becomes valid.

9. The circuit of claim 8 wherein said receive byte clock means comprises a set-reset flip-flop having a set and a reset terminal, each of said set and reset terminals being connected to the Q output of one of the stages of said ring counter means such that when said set-reset flip-flop is set, the bits of one byte are valid and when said set-reset flip-flop is reset, the bits of the other byte are valid.

10. A circuit for converting a multi-bit data signal from a first format to a second format, said circuit comprising:

input means for receiving said multi-bit data signal in said first format;

output means for providing said multi-bit data signal in said second format;

ring counter means having a plurality of stages, each stage having an output, the outputs of said plurality of stages for providing, in sequential order stage output signals; and format conversion means connected between said input means and said output means, said format conversion means having a plurality of latches, each latch being connected to said input means for simultaneously receiving data bits of the multi-bit data signal in said first format, control means for controlling the latching of selected data bits from said input means into each of said latches, and transmission means between said latches and said output means for sequentially transmitting the bits latched in said latches to said output means responsive to being addressed by the sequential stage output signals of said ring counter means, thereby placing the multi-bit data signal in said second format;

said input means includes a plurality of input terminals for together receiving said multi-bit data signal in a parallel format, and a plurality of output terminals for together providing said multi-bit data signal in the parallel format received on its input terminals;

each of said latches in said format conversion means comprises a C input, a D input connected to a respective one of the output terminals of said input means for receiving a respective bit of said multi-bit data signal, and a Q output;

said transmission means comprises selector means having a plurality of D inputs, each D input connected to the Q output of the respective one of said latches in said format conversion means, a Q output connected to said output means, and a plurality of C inputs, each C input connected to the output of the respective one of the stages of said ring counter means such that each stage output signal from said ring counter means causes the respective bit of said multi-bit data signal received by said input means in said parallel format to be provided to said output means in a serial format; and said control means comprises a read signal means connected to the C inputs of said latches for latching bits on the input terminals of said input means into said latches at a time when said bits on said input terminals are valid.

11. The circuit of claim 10 wherein said input means and said latches are divided for receiving two bytes of data in parallel format, each byte having a plurality of bits; and said read signal means comprises conductor means for providing a read signal to transfer one byte of said two bytes of data from said input means into the respective latches of said format conversion means at a time when one bit of the other byte of said two bytes of data is being transferred by said selector means to said output means.

12. The circuit of claim 10 wherein said read conductor means comprises a read conductor for each byte of data, each of said read conductors connected between the Q output of one of the stages of said ring counter means and all of the C inputs of the latches of its respective byte of data.

13. The circuit of claim 12 further comprising a transmit byte clock means connected to said ring counter means for controlling the transmission of each byte of data to said input means.

14. The circuit of claim 13 wherein said transmit byte clock means comprises a set-reset flip-flop having a set terminal and a reset terminal, each of said set and reset terminals being connected to one of said read conductors.

15. The circuit for converting a multi-bit data signal from a first format to a second format, said circuit comprising:

a plurality of latches, each latch having a D input for receiving data bits of said multi-bit data signal in said first format, a Q output on which is placed the data bit latched in said latch, and a C input for causing the latch to latch the data bit on its D input responsive to a signal received by said C input;

ring counter means having a plurality of numbered stages, each of said stages having an output, wherein selected ones of the outputs of said stages are connected to one or more of the C inputs of said latches; and clock means in said ring counter means for enabling said ring counter means to place a stage output signal, one at a time and in numeric order, on the outputs of said stages for addressing said latches in sequential order such that as each addressed latch receives its respective stage output signal, it latches the data bit then on its D input and places the latched data bit on its Q output for sequentially converting said multi-bit data signal to said second format.

16. The circuit of claim 15 wherein said clock means has a CLOCK conductor for providing a CLOCK signal and a CLOCK* conductor for providing the complement of said CLOCK signal, the output of each of said stages of said ring counter means includes a stage signal output node and a stage signal complement output node, and each of said stages of said ring counter means further comprises:

a current source;

a first bipolar transistor having its emitter connected to said current source and its base connected to one of either said CLOCK conductor or said CLOCK* conductor;

a second bipolar transistor having its emitter connected to said current source and its base connected to the other of either said CLOCK conductor or said CLOCK* conductor;

a voltage source separately connected to said stage signal output node and said stage signal complement output node;

a third bipolar transistor having its emitter connected to the collector of said first bipolar transistor, and its collector connected to said stage signal complement output node;

a forth bipolar transistor having its emitter connected to the collector of said first bipolar transistor, and its collector connected to said stage signal output node; and fifth and sixth bipolar transistors having their collectors and bases cross-coupled and their emitters connected to the collector of said second bipolar transistor, the collector of said fifth bipolar transistor being connected to said stage signal output node and the collector of said sixth bipolar transistor being connected to said stage signal complement output node;

said stage signal complement output node being connected to the base of the third transistor of the immediately succeeding stage of said ring counter means; and said stage signal output node being connected to the base of the forth transistor of said immediately succeeding stage of said ring counter means.

17. The circuit of claim 16 wherein in the odd numbered stages, the bases of said first bipolar transistors are connected to said CLOCK conductor, and the bases of said second bipolar transistors are connected to said CLOCK* conductor; and in the even numbered stages, the bases of said first bipolar transistors are connected to said CLOCK* conductor, and the bases of said second bipolar transistors are connected to said CLOCK conductor.

18. The circuit of claim 17 wherein said stage signal output node of the last stage is connected to the base of said third bipolar transistor of the first stage, and said stage signal complement output node of the last stage is connected to the base of said forth bipolar transistor of the first stage.

19. The circuit of claim 17 further comprising:

a multi-input NOR gate having a plurality of input terminals, one input terminal being connected to each of the stage output signal nodes of the even numbered stages except for the last even numbered stage, a plurality of complement input terminals, one complement input terminal being connected to each of the stage signal complement output terminals of the even numbered stages except for the last even numbered stage, a NOR gate output terminal connected to the base of said third bipolar transistor of the first stage, and a NOR gate complement output terminal connected to the base of said forth bipolar transistor of the first stage.

20. The circuit of claim 16 wherein said current source is a grounded first resistor.

21. The circuit of claim 16 wherein said voltage source is connected to said stage signal output node in series with a second resistor, and said voltage source is further connected to said stage signal complement output node in series with a third resistor.

22. The circuit of claim 16 wherein said D input of each of said latches includes a data input and a data complement input, said C input of each of said latches includes a latch clock input and a latch clock complement input, and each of said latches further comprises:

a second current source;

a seventh bipolar transistor having its emitter connected to said second current source and its base forming said latch clock complement input and connected to the stage signal complement output node of a selected one of said stages;

an eighth bipolar transistor having its emitter connected to said second current source and its base forming said latch clock input and connected to the stage signal output node of said selected stage;

a data signal output node forming said Q output of the latch;

a data signal complement output node;

a second voltage source separately connected to said data signal output node and said data signal complement output node;

a ninth bipolar transistor having its emitter connected to the collector of said eighth bipolar transistor, its collector connected to said data signal output node, and its base forming said data complement input of the latch;

a tenth bipolar transistor having its emitter connected to the collector of said eighth bipolar transistor, its collector connected to said data signal complement output node, and its base forming said data input of the latch; and eleventh and twelfth bipolar transistors having their collectors and bases cross-coupled and their emitters connected to the collector of said seventh bipolar transistor, the collector of said eleventh bipolar transistor being connected to said data signal output node and the collector of said twelfth bipolar transistor being connected to said data signal complement output node.

23. The circuit of claim 22 wherein said second current source is a grounded forth resistor.

24. The circuit of claim 23 wherein said second voltage source is connected to said data signal output node in series with a fifth resistor, and said second voltage source is further connected to said data signal complement output node in series with a sixth resistor.

25. The circuit of claim 15 further comprising:
a serial data input conductor connected to all of the D inputs of said latches;
conductor means connecting the C input of each of said latches to the output of a respective one of said stages such that serial data bits on said serial data input conductor and said serial data complement input conductor are converted to parallel data bits on the Q outputs of said latches.

26. The circuit of claim 15 wherein the number of stages of said ring counter is equal to the number of said latches, said circuit further comprising:
selector means having a plurality of D inputs, one of said D inputs connected to a respective one of the Q outputs of said latches, a plurality of C inputs, one of said C inputs connected to a respective one of the outputs of said stages, and a Q output for providing the data bit on a D input of said selector means when its respective C input receives a stage output signal from the respective stage of said ring counter means; and
read means connecting the output of a selected stage of said ring counter means to the C inputs of a selected group of said latches for converting a byte of parallel data bits on the D inputs of said selected group of latches to serial data bits on the Q output of said selector means.

* * * * *